United States Patent
Gunther et al.

[11] Patent Number: 6,134,119
[45] Date of Patent: Oct. 17, 2000

[54] MODULE SUPPORT STRUCTURE

[75] Inventors: Hans-Ulrich Gunther, Pfinztal; Paul Mazura, Karlsbad; Volker Haag, Bad Wildbad; Klaus Pfeifer, Karlsruhe; Klaus-Michael Thalau, Malsch; Michael Joist, Gaggenau; Udo Weiss, Straubenhardt, all of Germany

[73] Assignee: Schroff GmbH, Straubenhardt, Germany

[21] Appl. No.: 08/957,597

[22] Filed: Oct. 24, 1997

[30] Foreign Application Priority Data

Oct. 25, 1996 [DE] Germany .......................... 196 44 420

[51] Int. Cl.$^7$ ...................................................... H05K 9/00
[52] U.S. Cl. ..................... 361/800; 174/35 MS; 361/799
[58] Field of Search ..................... 361/799, 800, 361/818, 816; 174/35 R, 35 GC, 35 MS

[56] References Cited

U.S. PATENT DOCUMENTS

| | | | |
|---|---|---|---|
| 4,154,493 | 5/1979 | Prater | 312/257 R |
| 5,373,101 | 12/1994 | Barabolak | 174/35 GC |
| 5,386,346 | 1/1995 | Gleadall | 361/800 |
| 5,539,149 | 7/1996 | Gatti | 174/35 GC |
| 5,585,599 | 12/1996 | Schwenk et al. | 174/35 R |
| 5,930,120 | 7/1999 | Gunther et al. | 361/800 |

FOREIGN PATENT DOCUMENTS

| | | |
|---|---|---|
| 71975/74 | 2/1976 | Australia . |
| 86197/82 | 1/1983 | Australia . |
| 0 038 652 | 10/1981 | European Pat. Off. . |
| 0 545 158 | 6/1993 | European Pat. Off. . |
| 0 596 349 | 5/1994 | European Pat. Off. . |
| 319339 | 3/1920 | Germany . |
| 3039681 C1 | 4/1984 | Germany . |
| 9106954 | 11/1991 | Germany . |
| 0517135 A1 | 12/1992 | Germany . |
| 41 26 576 A1 | 2/1993 | Germany . |
| 296 02 426 U1 | 5/1996 | Germany . |
| 2 213 328 | 8/1989 | United Kingdom . |
| WO 95/15675 | 6/1995 | WIPO . |

OTHER PUBLICATIONS

Rittal Brochure, Rittal Ripac nach den neuesten internationalen Standards, Apr. 1996, pp. 5–6.

Siemens Aktiengesellschaft, Handbuch der Elektrotechnik, Apr. 1971, pp. 846, 847.

Siemens AG Fachibibliothek Erl S, Aluminum–Taschenbuch, 1996, pp 478–481 and 496,497, no month.

Bavaria Elektronik Brochure, RFI–EMI–EMP Abschirmtechnik, Gesamtkatalog, 1994, no month.

*Primary Examiner*—Neil Abrams
*Attorney, Agent, or Firm*—Merchant & Gould P.C.

[57] ABSTRACT

A shielded module support structure for printed circuit boards 2 can be inserted on guide rail 7 and having electrical or electronic components has two parallel side walls 3 and at least four module rails 4 for bearing the guide rails 7. The module rails are anodized aluminum or an anodized aluminum alloy and have, at the front side, at least one seating surface 12 for one or more front plates 9, to improve electrical conductivity, sections of the module rails 4 are freed from the anodized layer. This can be done by removal of protrusions 18 by processes such as mechanical milling. For improved contacting, resilient contact bands 19 may be snapped onto the rails 4 into engagement with the bared seating surfaces 12. The resilient contact bands include sharp-edged breakouts 22 for conductive engagement with plates 9 for effecting a shielded enclosure about the circuit boards 2.

16 Claims, 4 Drawing Sheets

MODULE SUPPORT STRUCTURE

BACKGROUND OF THE INVENTION

The invention concerns a module support structure for printed circuit boards which can be inserted on guide rails and having electrical or electronic components. The module support structure comprises two parallel side walls and at least four parallel module rails connecting the side walls and bearing the guide rails.

Electronic circuits, in particular digital ones, have increasingly lower switching thresholds and are sensitive to interfering ambient radio frequency fields. For this reason, module support structures having printed circuit boards bearing this kind of sensitive circuitry must be shielded at all sides. Towards this end, one uses radio frequency sealed side walls and upper and lower sheet metal as well as rear covers. Shielding with respect to interfering radio frequency fields in the region of the front plate is, however, more problematic since individual printed circuit boards should be removable at any time. Particularly when the module support structure does not have a common front plate extending over the entire width of the module support structure, rather accepts plug-in modules having the inserted printed circuit boards mounted to individual front plates, the gaps between the front plates and the module support structure cause special problems, particularly at the module rails.

Shielding of the vertical gaps between the individual front plates and between the sideward front plates and the side walls is usually effected using resilient elements as e.g. described in the patent publication DE 41 10 800 C1, due to the applicant. Herein, resilient metallic elements are placed on the legs of a U-shaped front plate which each press against the neighboring front plate or against the side wall of the module support structure when the plug-in module is inserted to thereby effect the required low resistance area contact.

Differing approaches have been taken for shielding the horizontal gap between the front plates and the cover and floor sheets. The cover and floor sheets are usually contacted to the four module rails which each seat in the corners of the side walls and connect the side walls to each other. A low resistance contact is simultaneously provided between the front plates and the two front module rails to effect complete over-all shielding.

Known in the art from DE 41 26 576 A1 is a module support structure with module rails having a groove opened towards the front side of the module support structure for accepting a threaded-hole-strip and at least one seating surface for the front plate. Resilient elements are provided for which are inserted into the open grooves of the module rails and seat in widened portions of the grooves in front of the threaded-hole-strip. These resilient elements have an angled strip which protrudes beyond the grooves of the module rails in the forward direction and is pushed-in towards the threaded-hole-strip by the front plates in opposition to a resilient elastic force.

A contact element is known in the art from DE 296 02 426 U1 which seats in the groove, opening towards the front, of a module rail and is disposed in front of the threaded-hole-strip. The contacting is thereby effected via equidistantly disposed contact spikes projecting in a forward direction beyond the module rail.

One must however assure, when contacting the front plates as well as the cover and floor sheets to the module rails of the module support structure, that electrical contact is not impaired by oxidation layers. This is the case both for direct contact between the components as well as when utilizing an intermediate resilient element.

Module rails usually consist essentially of extruded aluminum profiled structures which are mechanically post-processed through sawing, punching or drilling. The naturally occurring oxide layer of untreated aluminum is very thin so that the surface of extruded aluminum profiled structures is unavoidably scratched during mechanical post-processing. Moreover, the naturally occurring oxide layer cannot prevent further irregular oxidation of the untreated aluminum profiled structures during transport or storage so that a generally undesirable surface is formed. In order to counteract this problem, the profiled aluminum structures are usually anodized directly following their manufacture. An anodized surface can be mechanically post-processed without scratching.

The electrical conductivity of a contact to aluminum having a naturally developed oxide layer is adequate for shielding against radio frequency alternating fields. The transition resistance of an anodized aluminum surface is, however, too large. For this reason, two differing types of module support structures have been provided for in prior art: module support structures without shielding having anodized aluminum module rails, and shielded module support structures with which, following mechanical post-processing, the originally anodized module rails are completely chemically freed from their anodized layer in a caustic solution. This required double storage by the module support structure manufacturer with regard to the module rails. Moreover, it is nearly impossible to retroactively shield a module support structure having anodized module rails.

SUMMARY OF THE INVENTION

It is therefore the underlying purpose of the invention to provide a module support structure of the above mentioned kind with module rails having resistant surfaces which are nevertheless easily adapted for use in a module support structure shielded against interfering radio frequency fields.

This purpose is achieved by a module support structure having the features of claim 1.

Advantageous configurations and improvements in the invention can be extracted from claims 2 through 15.

The module support structure in accordance with the invention therefore comprises two parallel side walls and at least four parallel module rails made from anodized aluminum or an anodized aluminum alloy connecting the side walls and bearing the guide rails with printed circuit boards which can be inserted and removed. At least one seating surface is provided on each front module rail for one or more front plates. In accordance with the invention, these seating surfaces are, at least in sections, freed from their anodized layer through mechanical removal. In the simplest case, the mechanical removal can be effected through milling or polishing.

The module support structure in accordance with the invention therefore comprises module rails which substantially maintain their anodized surfaces but which nevertheless—by means of a simple mechanical processing step—can be utilized for module support structures which are shielded against interfering radio frequency fields. Manufacturers of module support structures can thereby avoid both the chemical removal of anodized layers as well as the double storing of module rails. At the same time, one has the advantage that the module rails of shielded module support structures remain substantially anodized so that their surfaces remain uniform and resistant. These module rails even allow a retroactive shielding of module support structures which were initially unshielded.

It is particularly advantageous when the anodized module rails have protrusions in the regions which are to be mechanically freed from the anodized layer. Mechanical removal of the protrusions allows for simple removal of the anodized layer without changing the final dimensions of the module rail.

It is particularly advantageous to manufacture the mounting rails as extruded profiled structures. Manufacturing as extruded profiled structures facilitates highly precise, simple formation of the protrusions in accordance with the invention. A continuous mechanical removal process, such as e.g. continuous milling, can subsequently be used to easily even-out these protrusions with equally high precision.

In order to mount the front plates to the module rails, the front module rails can each have a groove opened towards the front side of the module support structure. A threaded-hole-strip is inserted into this groove into which mounting bolts for the front plate pieces can be screwed.

It is particularly advantageous when resilient contact bands can be placed onto seating surfaces of the front module rails freed in sections from their anodized layer to assure the necessary low resistance contact for shielding against interfering radio frequency fields. This type of resilient contact band can be retroactively placed onto the seating surface to effect shielding of a module support structure even at a later point in time. The resilient contact bands preferentially have substantially U-shaped cross sections with inwardly bent clamping edges to facilitate snapping onto the seating surfaces of the module rails.

In the event that the resilient contact bands consist essentially of a plurality of equal sections between each of which an intended breaking location is disposed, they can be manufactured in a continuous manner and shortened to the required length in each case for sealed radio frequency shielding of a module support structure. The intended breaking locations allow the resilient contact band to be broken-off by hand to the desired length.

It is preferred when the front module rails each have, behind their seating surfaces, an upper engagement groove and a lower engagement groove, wherein the resilient contact bands engage behind the seating surfaces at both sides to snap into the engagement grooves. When the resilient contact bands consist essentially of flat sheet metal, the upper and lower edges of which are bent over in such a manner that they engage into the respective engagement groove of the module rails, the intrinsic elasticity of the sheet metal secures the resilient contact bands to the module rails.

The resilient contact bands preferentially comprise a plurality of contact elements. These contact elements preferentially consist essentially of break-outs resiliently facing the front of the module support structure as well as contact spikes facing the seating surface. The resilient structure of the break-outs guarantees that the front plates must be moved towards the modules rails in opposition to a resilient force. The break-outs are thereby elastically deformed and penetrate into the surface of the inside of the front plates to secure electrical contact. At the same time, the sharp-edged contact spikes on the back of the resilient contact bands are pushed against the seating surface of the module rails to secure contact to the module rails.

Configuration of the resilient contact bands as flat sheet metal having break-outs and contact spikes also has additional advantages. The seating surface of the front module rails simultaneously serves, in module support structures equipped with plug-in modules, as a contact surface for plug-in module removal means. When a plug-in module is removed, removal forces occur assuming values of easily 100 N and more. When the removal means thereby seats against the seating surface of the front module rails, the resilient contact bands, made from flat sheet metal, cannot be damaged. A suitable formation of the break-outs, e.g. with a substantially vertical cut and two triangular leaf springs bent-away therefrom which can be elastically deformed up to seating on the seating surface, can also prevent damage by the removal means to the break-outs in the resilient contact band.

The module rails in accordance with the invention can, in addition to the smooth seating surface sections for contacting of the front plates, also have mounting grooves, e.g. for the cover plates whose inside surfaces are likewise, at least in sections, freed from their anodized layer to thereby also provide excellent contact at these locations.

Particular manufacturing advantages result when the mounting grooves are also provided with protrusions in the regions which are to be mechanically freed from the anodized layer. These protrusions can be milled-off without changing the final dimensions of the mounting grooves.

A reliable contacting of a top sheet or a bottom sheet in the mounting groove of a mounting rail is preferentially facilitated by resilient elements which can be clamped into the mounting groove. These resilient elements effect the low resistance contact, needed for shielding against interfering radio frequency fields, also between the module rails and the top sheet or floor sheet. The resilient elements can be retroactively placed into the mounting grooves to effect shielding of a module support structure at a later time.

An embodiment of the invention is more closely described below with reference to the accompanying drawing.

DESCRIPTION OF THE PREFERRED EMBODIMENT

Figure 1:
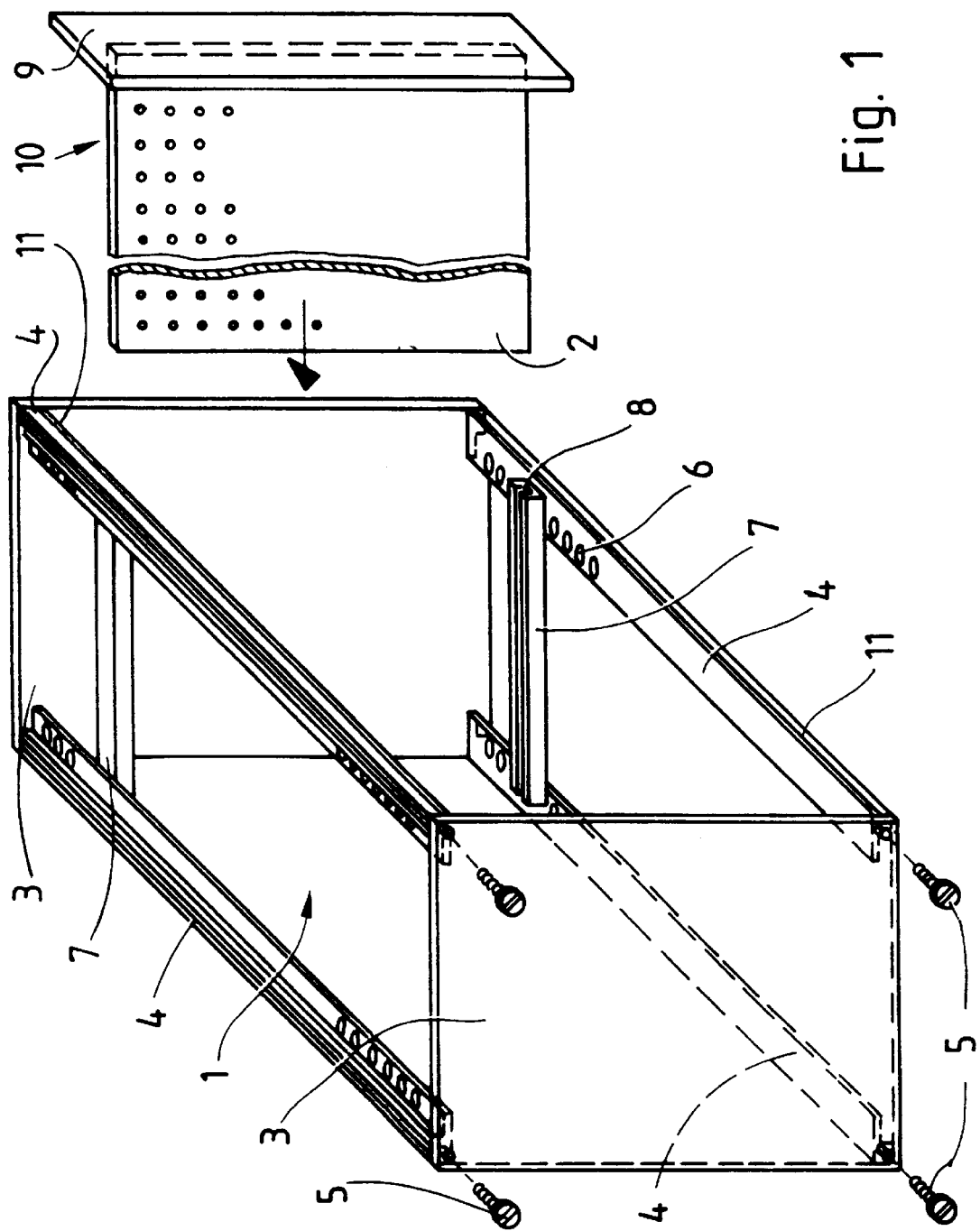
FIG. 1 shows a schematic view of a module support structure.

FIG. 1 shows a perspective schematic view of a module support structure 1 for acceptance of printed circuit boards 2 having electronic components (not shown). The module support structure 1 shown comprises two side walls 3 and four module rails 4 which connect the side walls 3 and are attached to same via mounting bolts 5. The module rails 4 have slotted holes 6 disposed in a particular separation pattern into which upper and lower guide rails 7 can be inserted. Each guide rail 7 has a guide groove 8 for acceptance of the printed circuit boards 2. The printed circuit board 2 shown, illustrated in a shortened manner for reasons of clarity, is mounted to a front plate 9 and forms, together therewith, a plug-in module 10. The front plates 9 can be mounted to the front module rails 4 by means of an open groove 11.

The upper and lower plates as well as a rear cover and additional front plate elements, which must also clearly be present to effect shielding against interfering radio frequency fields, are not shown in FIG. 1.

Figure 2:
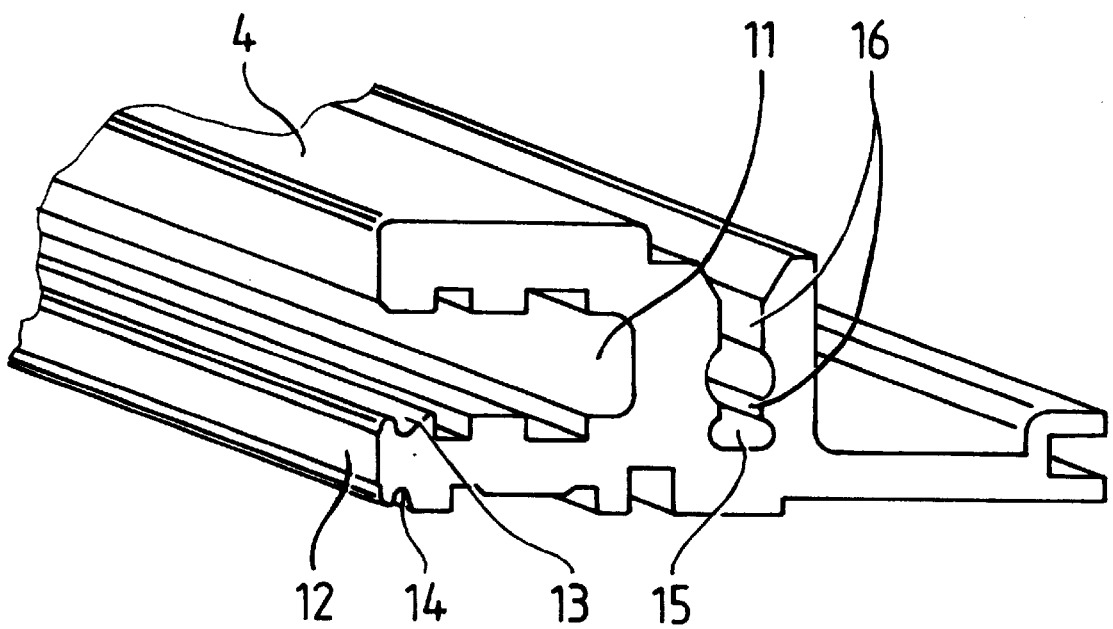
FIG. 2 shows a perspective view of a section of a front module rail.

FIG. 2 shows a perspective view of a module rail 4. The module rail 4 has a forwardly opened groove 11 into the inner widened region of which a threaded-hole-strip (not shown) is inserted. The module rail 4 has a smoothly milled seating surface 12 below the groove 11. An upper engagement groove 13 and a lower engagement groove 14 are disposed behind the seating surface 12. A mounting groove 15 for mounting a cover plate is also located in the module rail 4, in addition to the forwardly opened groove 11. This mounting groove 15 also has smoothly milled contact surfaces 16.

Figure 3:
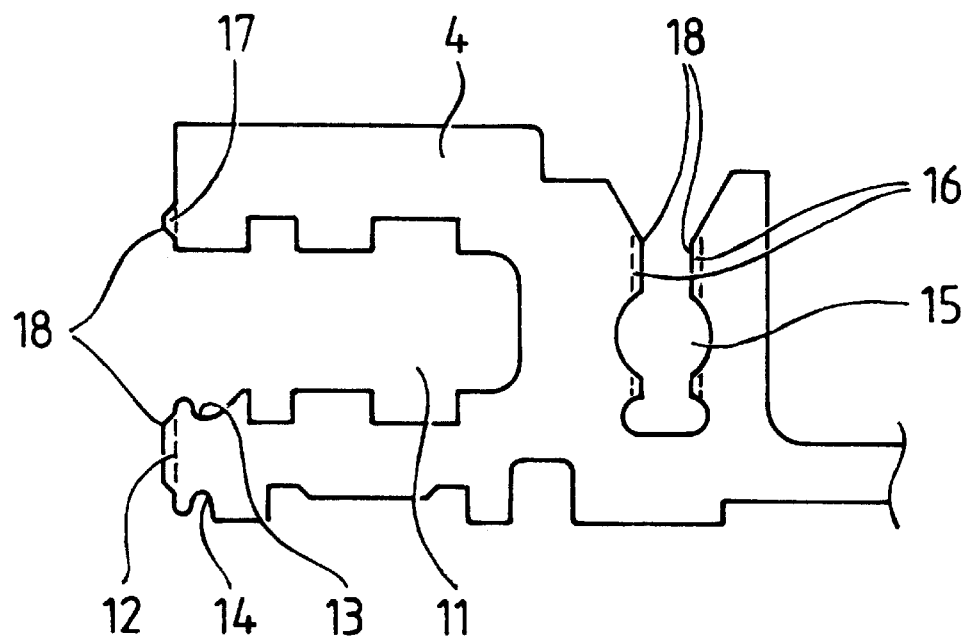
FIG. 3 shows a side view of a section of a front module rail.

FIG. 3 shows the side view of the module rail 4 represented in FIG. 2 in the form of an intermediate product prior to the smooth milling of the seating surface 12 and contact surfaces 16. Protrusions 18 can be seen on the seating surface 12 as well as on an additional contact surface 17, both of which are disposed at the front of the module rail 4 and are indicated with dashed lines. The anodized layer which otherwise covers the surface of the module rails 4, is removed from the seating surface 12 and the additional contact surface 17 via continuous milling off of the protrusions 18. The contact surfaces 16 of the mounting groove 15, likewise indicated with dashed lines, are similarly provided with protrusions 18 which are milled-off to contact the cover plate (not shown) with the module rail 4.

Figure 4:
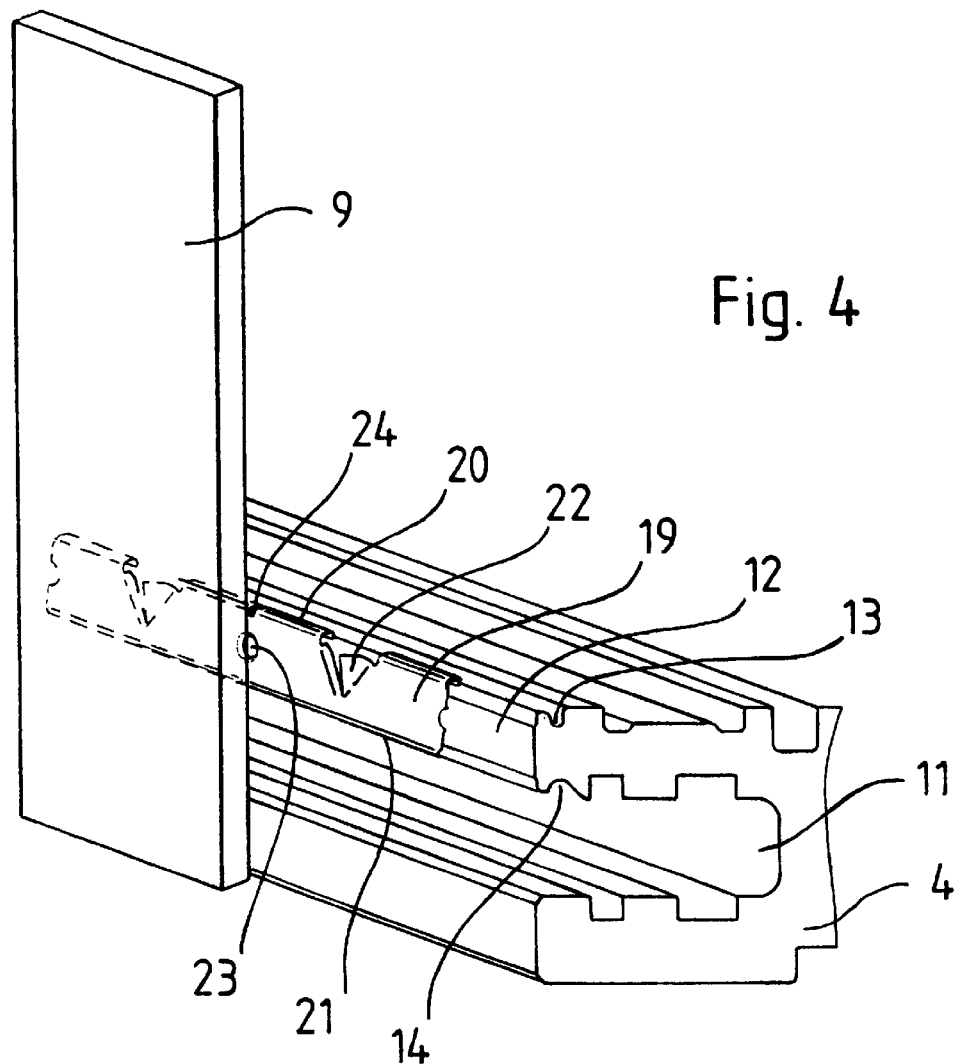
FIG. 4 shows the contacting of a module rail with a front plate.

FIG. 4 schematically shows the contacting of a module rail 4 to a front plate 9 of a plug-in module 10. A module rail 4 is thereby shown which forms the front lower edge of a module support structure 1. For this reason its profile is disposed mirror symmetrically relative to that of the front upper module rail 4 shown in FIGS. 2 and 3. As in FIGS. 2 and 3, the module rail 4 shown in FIG. 4 also has a forwardly opened groove 11 for acceptance of a threaded-hole-strip which can be inserted into the inner widened region of the groove 11. A mounting bolt (not shown) can be passed through a mounting opening in the front plate 9 and be screwed into a threaded hole of the threaded-hole-strip.

The module rail 4 has a smoothly milled seating surface 12 above the groove 11. An upper engagement groove 13 and a lower engagement groove 14 can be seen behind this seating surface 12. A resilient contact band 19 seats on the seating surface 12 and consists essentially of a flat stainless steel sheet the upper 20 and lower 21 edges of which are bent-over inwardly to engage into the upper engagement groove 13 and lower engagement groove 14, respectively. The resilient contact band 19 is solely connected to the module rail 4 through snapping onto the seating surface 12.

The resilient contact band 19 has forwardly facing breakouts 22 which provide the electrical contact to the front plate 9 as well as contact claws 23 facing the seating surface 12 to secure electrical contact to the module rail 4. Each break-out 22 consists essentially of a vertical cut and two triangular leaf springs bent-away therefrom and having sharply pointed edges. When the front plate 9 is pushed towards the module rail 4, the leaf springs of the break-outs 22 are elastically deformed. Their sharply formed edges penetrate through a possible oxide layer on the front plate 9. In the example shown, the contact spike 23 is configured as a sharp-edged material protuberance and seats at the intended breaking location 24 between two identical sections of the resilient contact band 19.

Figure 5:
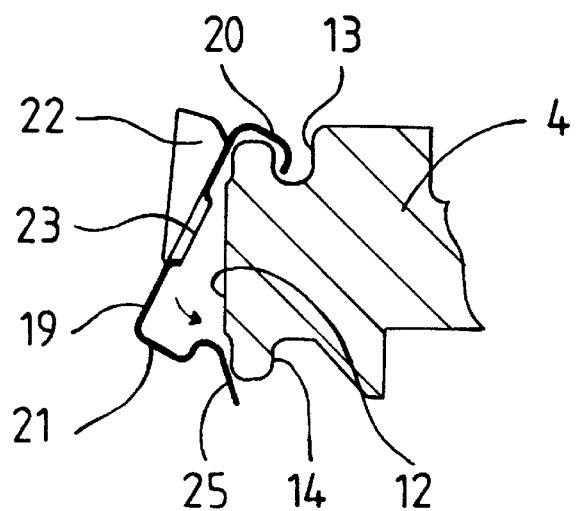
FIG. 5 shows a cut through a resilient contact band which is snapped onto a module rail.

FIG. 5 illustrates the snapping of a resilient contact band 19 onto a module rail 4. The resilient contact band 19, having the break-outs 22 and contact spikes 23, is initially placed into the upper engagement groove 13 of the module rail 4 at its upper doubly bent edge 20. The likewise doubly bent lower edge 21 of the resilient contact band is then snapped into the lower engagement groove 14 with the assistance of the slanted abutment 25. The resilient contact band 19 then seats on the seating surface 12 of the module rail 4 and is firmly held by the intrinsic elasticity.

Figure 6:
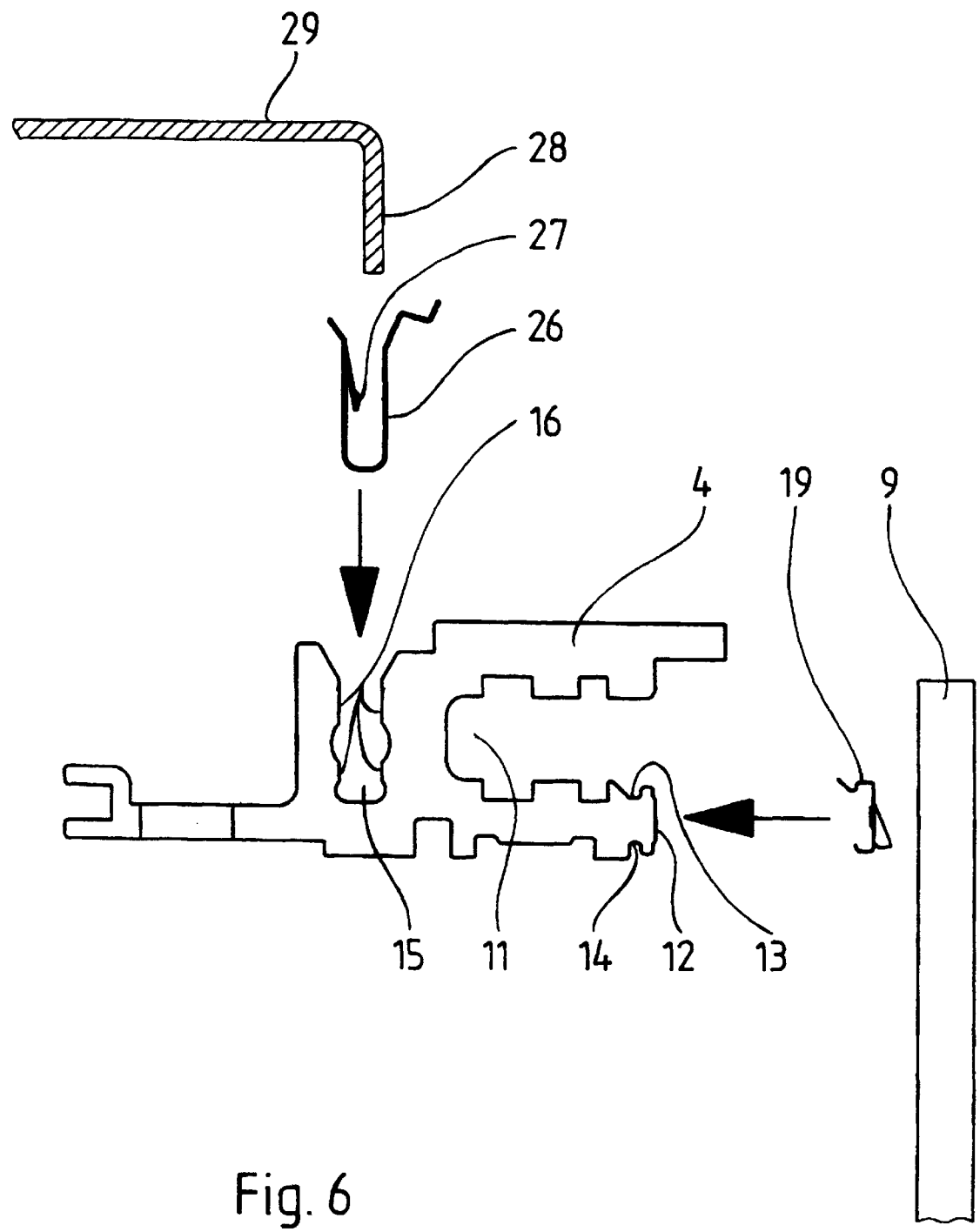
FIG. 6 shows the contacting of a module rail with a front plate and the top plate.

FIG. 6 shows the side view of a front upper module rail 4 which also has a mounting groove 15, in addition to the groove 11 for mounting the front plate 9. For radio frequency shielding, a resilient contact band 19 is snapped onto the seating surface 12 to secure contacting of the front plate 9 to the module rail 4. A resilient element 26 is clamped into the mounting groove 15 and seats on the smoothly milled contact surface 16 of the module rail 4. The resilient element 26 has an inward split resilient tongue 27 by means of which a cornered border strip 28 of a cover 29 is contacted in a resilient manner. The cover 29 is thereby connected to the module rail 4 in an electrically conducting manner via the resilient element 26.

What is claimed is:

1. A module support structure for printed circuit boards which can be inserted on guide rails and having electrical or electronic components, comprising:

two parallel side walls (3);

at least four parallel module rails (4) made from anodized aluminum or an anodized aluminum alloy connecting the side walls (3) and bearing guide rails (7);

at least one seating surface (12) on each front module rail (4) for one or more front plates (9);

wherein protrusions (18) on the seating surfaces (12) are mechanically removed to free the seating surfaces (12) from their anodized layer in the regions of the protrusions to provide an electrical path of improved conductivity between the seating surfaces and the front plates.

2. The module support structure of claim 1, wherein the module rails (4) are configured as extruded profiled structures.

3. The module support structure of claim 1, wherein the front module rails (4) each have a groove (11) opened towards a front side of the module support structure (1) for accepting a threaded-hole-strip.

4. The module support structure of claim 1, wherein a resilient contact band (19) can be pushed onto a seating surface (12) of the front module rail (4).

5. The module support structure of claim 4, wherein the resilient contact band (19) has a substantially U-shaped cross section.

6. The module support structure of claim 5, wherein the resilient contact band (19) bears inwardly bent clamping edges.

7. The module support structure of claim 4, wherein the resilient contact band (19) comprises a plurality of equal sections between each of which an intended breaking location (24) is disposed.

8. The module support structure of claim 4, wherein the front module rails (4) each have, behind seating surfaces (12), an upper engagement groove (13) and a lower engagement groove (14), wherein the resilient contact band (19) engages behind the seating surfaces (12) at both sides to snap into engagement grooves (13, 14).

9. The module support structure of claim 8, wherein the resilient contact band (19) comprises sheet metal and wherein the resilient contact band (19) has upper and lower edges (20, 21) bent away in such a manner that the edges engage into the respective engagement groove (13, 14) of the module rail (4).

10. The module support structure of claim 1, wherein the resilient contact band (19) comprises a plurality of contact elements.

11. The module support structure of claim 10, wherein the resilient contact band (19) have plurality of break-outs (22) resiliently facing the front of the module support structure (1) and a plurality of contact spikes (23) facing the seating surface (12).

12. The module support structure of claim 1, wherein the module rails (4) have mounting grooves (15) having inner surfaces having anodized layers which are, at least in sections, freed from their anodized layer by means of mechanical removal.

13. The module support structure of claim 12, wherein protrusions (18) in the mounting grooves (15) are mechanically removed to free the mounting grooves (15) from their anodized layer.

14. The module support structure of claim 12, wherein resilient elements (26) are provided for which can be clamped in the mounting grooves (15) to contact the module rails (4) with border strips (28) of a cover (29) or of a floor.

15. A module support structure for printed circuit boards which can be inserted on guide rails and having electrical or electronic components, comprising:

two parallel side walls (3);

at least four parallel module rails (4) made from anodized aluminum or an anodized aluminum alloy connecting the side walls (3) and bearing guide rails (7);

at least one seating surface (12) on each front module rail (4) for one or more front plates (9);

wherein protrusions (18) on the seating surfaces (12) are removed to free the seating surfaces (12) from their anodized layer in the regions of the protrusions (18).

16. The module support structure of claim 15, wherein removal of the anodized layer provides an electrical path of improved conductivity between the seating surfaces (12) and the front plates (9).

* * * * *